US012763750B2

(12) United States Patent
Gruber et al.

(10) Patent No.: US 12,763,750 B2
(45) Date of Patent: Oct. 13, 2026

(54) BEAT MODE SUPPRESSION IN POWERBARS AND QUADBARS

(71) Applicant: Avago Technologies International Sales Pte. Limited, Singapore (SG)

(72) Inventors: Michael Gruber, Baldham (DE); Alberto Hueltes, Pentling (DE); Andriy Yatsenko, Munich (DE); Martin Handtmann, Riemerling (DE); Florian Hrubesch, Weilheim (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 406 days.

(21) Appl. No.: 18/362,548

(22) Filed: Jul. 31, 2023

(65) Prior Publication Data

US 2025/0047259 A1 Feb. 6, 2025

(51) Int. Cl.

*H03H 9/02* (2006.01)
*H03H 9/13* (2006.01)
*H03H 9/205* (2006.01)
*H03H 9/60* (2006.01)

(52) U.S. Cl.

CPC .... *H03H 9/02125* (2013.01); *H03H 9/02086* (2013.01); *H03H 9/132* (2013.01); *H03H 9/205* (2013.01); *H03H 9/605* (2013.01)

(58) Field of Classification Search

CPC .. H03H 9/205; H03H 9/02086; H03H 9/0542; H03H 9/605; H03H 9/132; H03H 9/568; H03H 9/02125; H03H 9/02015; H03H 9/02047; H03H 9/171; H10N 30/87

USPC .................................................. 333/187, 188

See application file for complete search history.

(56) References Cited

U.S. PATENT DOCUMENTS

| | | | | |
|---|---|---|---|---|
| 7,567,023 | B2 * | 7/2009 | Iwaki | H03H 9/132 310/365 |
| 2017/0019085 | A1 * | 1/2017 | Kida | H03H 9/205 |
| 2018/0006631 | A1 | 1/2018 | Kida et al. | |

FOREIGN PATENT DOCUMENTS

| | | | |
|---|---|---|---|
| JP | 2010-087578 | A | 4/2010 |
| JP | 2022-507318 | A | 1/2022 |

OTHER PUBLICATIONS

Partial European Search Report, European Application No. 24191115.5 dated Jan. 30, 2025, 15 pages.

* cited by examiner

*Primary Examiner* — Jorge L Salazar, Jr.

(74) *Attorney, Agent, or Firm* — King Intellectual Asset Management

(57) ABSTRACT

A resonator for beat mode suppression is provided. A resonator includes a substrate comprising a top surface, a bottom electrode disposed on the top surface of the substrate, a piezoelectric layer disposed on the bottom electrode, and a top electrode disposed on the piezoelectric layer. The bottom electrode includes a first elongated member configured to extend longitudinally along the top surface on a first side of the substrate.

20 Claims, 5 Drawing Sheets

BEAT MODE SUPPRESSION IN POWERBARS AND QUADBARS

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for beat mode suppression in bulk acoustic wave resonators.

BACKGROUND

Bulk acoustic wave (BAW) resonators, such as thin-film bulk acoustic resonators (FBAR) are commonly implemented as radio frequency (RF) filters, also referred to as BAW filters. In the acoustically active frequency regime, BAW resonators have a series resonant frequency ($f_s$) and a parallel resonant frequency ($f_p$). Outside of this acoustic regime, BAW resonators behave like capacitors. To mitigate the effects of the second harmonic (H2) in BAW resonators, two flipped BAW resonators are placed in series configuration, referred to as a "powerbar" (or two pairs of flipped BAW resonators, referred to as a "quadbar") and shunt configurations, referred to as a "split-bar." In a typical ladder filter, powerbars are used to compensate the series path of the ladder filter, while split-bars are used to compensate the shunts, as $f_p$ and $f_s$ fall outside the passband.

As the BAW resonators exhibit acoustic and electromagnetic asymmetries, differences in $f_s/f_p$ of individual powerbars/split-bars may cause a beat mode (e.g., a range between the two frequencies $f_s$ and $f_p$), in which H2 suppression performance is degraded. In ultra-high-band (UHB) operation (5-7 GHz), shunt resonators cannot be placed in split-bar configuration as they become too small. In the UHB regime, shunt resonators are placed in a powerbar configuration, and the beat mode generated at $f_p$ falls inside the passband. This causes an unwanted spike in the linear response (e.g. insertion loss, Group Delay), in the H2 response and in the thermal response.

Thus, methods, systems, and apparatuses for beat mode suppression in powerbars and quadbars are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1A:
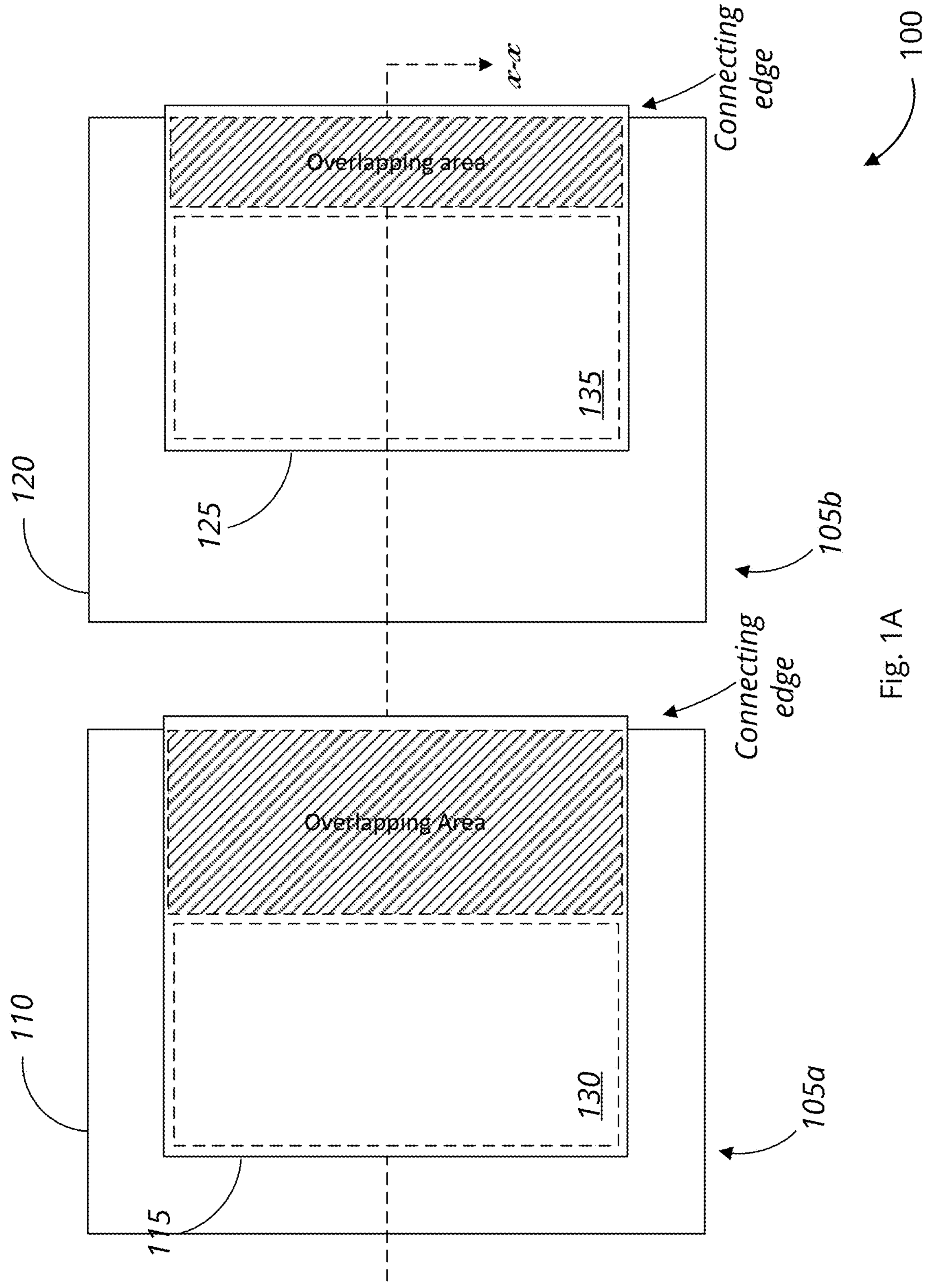
FIG. 1A is a schematic top view of a pair of bulk acoustic wave resonators, in accordance with various embodiments.

Various embodiments set forth a powerbar and/or quadbar configuration of BAW resonators.

In some embodiments, an apparatus for beat suppression in bulk acoustic wave resonators is provided. The apparatus includes one or more first resonators, each first resonator having a respective parasitic capacitance, and a second resonator having a second parasitic capacitance. The second resonator includes a substrate, a bottom electrode disposed on the substrate, a piezoelectric layer disposed on the bottom electrode, and a top electrode disposed on the piezoelectric layer. In the first region, the bottom electrode and top electrode overlap with no piezoelectric layer between the bottom electrode and top electrode, wherein an area of the first region is determined based, at least in part, on a difference between the second parasitic capacitance and the respective parasitic capacitance of at least one of the one or more first resonators.

In further embodiments, a resonator having an architecture for beat suppression is provided. The resonator includes a substrate comprising a top surface, a bottom electrode disposed on the top surface of the substrate, a piezoelectric layer disposed on the bottom electrode, and a top electrode disposed on the piezoelectric layer. The bottom electrode includes a first elongated member configured to extend longitudinally along the top surface on a first side of the substrate.

In further embodiments, an apparatus for beat suppression in bulk acoustic wave resonators is provided. The apparatus includes a first outer resonator having a first parasitic resonance. The first outer resonator includes a substrate comprising a top surface, a bottom electrode disposed on the top surface of the substrate, a piezoelectric layer disposed on the bottom electrode, and a top electrode disposed on the piezoelectric layer. The apparatus includes a first central resonator coupled to the first outer resonator, a second central resonator coupled to the first central resonator, and a second outer resonator coupled to the second central resonator. The bottom electrode includes a first elongated member configured to extend longitudinally at least partially around a first side of at least one of the second central resonator, first central resonator, or the second outer resonator along the top surface of the substrate.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having." as well as other forms, such as "includes," "included," "has." "have." and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A. B. and C. In instances where it is intended that a selection be of "at least one of each of A, B, and C." or alternatively, "at least one of A, at least one of B, and at least one of C." it is expressly described as such.

In conventional split bar arrangements, two BAW resonators are placed in parallel, but oriented to face opposite directions, (e.g., the axis of the piezo acoustic material is flipped). To maintain capacitance, and therefore impedance, of the stage, each individual BAW resonator is halved in size. At UHB operation, however, the size of the resonators becomes too small to implement as split-bars. Thus, in UHB, BAW filters (such as ladder filters) utilize powerbars or quadbars due to size constraints, where the size of each individual resonator is doubled or quadrupled in size in order to maintain capacitance in the series path. In quadbar configuration, each individual resonator is placed in series facing alternating directions. However, the beat mode at $f_p$ falls inside the passband of the BAW filter, causing an unwanted spike in the linear response.

The powerbar and quadbar configurations, set forth below, provide a new architecture for beat mode suppression. Specifically, capacitive loading of individual resonators within a powerbar and/or quadbar is used to compensate for differences in parasitic capacitance of individual resonators. Another aspect of the configuration is provided by equipotentialing via a shielding structure on one or more of the outer resonators of a quadbar.

Figure 1B:
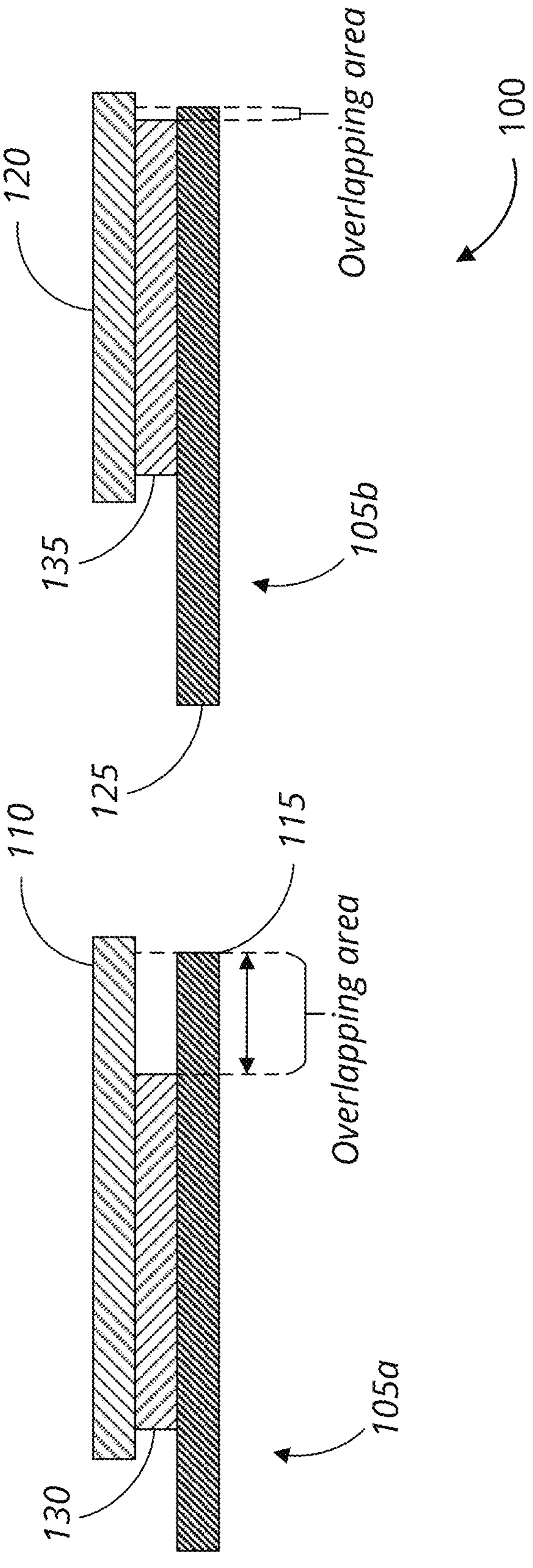
FIG. 1B is a schematic diagram of a cross-section of the pair of bulk acoustic wave resonators, in accordance with various embodiments.

FIG. 1A is a schematic top view of a pair of BAW resonators 100, in accordance with various embodiments. FIG. 1B is a schematic diagram of a cross-section of the pair of bulk acoustic wave resonators 100, taken across line x-x. The pair of BAW resonators 100 includes a first BAW resonator 105*a* (hereinafter, "first resonator 105*a*"), and a second BAW resonator 105*b* (hereinafter, "second resonator 105*b*"), where the first resonator 105*a* includes a first bottom electrode 110, first top electrode 115, and first piezoelectric layer 130, where the second resonator 105*b* includes a second bottom electrode 120, second top electrode 125, and second piezoelectric layer 135. It should be noted that the various parts and components of BAW resonators 100 are schematically illustrated in FIGS. 1A & 1B, and that modifications to the various components and other arrangements of the pair of BAW resonators 100 may be possible and in accordance with the various embodiments.

With reference to FIGS. 1A & 1B, the BAW resonators 105*a*, 105*b* may include FBAR or other types of BAW resonators. The first resonator 105*a* and second resonator 105*b* may be part of a powerbar and/or quadbar arrangement. In a powerbar arrangement, the first and second resonators 105*a*, 105*b* are placed in series, but flipped in orientation. As used herein, an orientation of the resonator may refer to a piezoelectric orientation of the piezoelectric material within the piezoelectric layer (e.g., a crystal or grain orientation). However, for purposes of visualization, FIG. 1A depicts the first resonator 105*a* and second resonator 105*b* are oriented in the same direction (e.g., connecting edge on the right side).

In various examples, an overlapping area of the first bottom electrode 110 and first top electrode 115 (e.g., an area in which the first top electrode 115 overlaps the first bottom electrode 110) determines a capacitance of the first resonator 105*a*. Thus, the capacitance of the first resonator 105*a* may be determined and/or adjusted by controlling the overlapping area of the first bottom electrode 110 and first top electrode 115. For example, a larger overlapping area results in larger capacitance, while a smaller overlapping area results in a smaller capacitance.

In various examples, the first and second bottom electrodes 110, 120 may respectively be deposited over a substrate. Suitable substrates may include, without limitation, ceramic, silicon, glass, or other suitable dielectric material. Thus, the bottom electrode 110,120 of a respective resonator 105*a*, 105*b*, may be disposed on a top surface of the substrate (including any shielding structure as will be described in greater detail below with respect to FIGS. 2A-2C). In some examples, a cavity may be present (e.g., air, other gas, or vacuum) between the substrate and the bottom electrode. A piezoelectric layer, such as the first or second piezoelectric layers 130, 135, may be disposed on a first region of the respective resonator 105*a*, 105*b*. A respective top electrode 115, 125 may be disposed on the respective piezoelectric layer 130, 135.

Figure 1C:
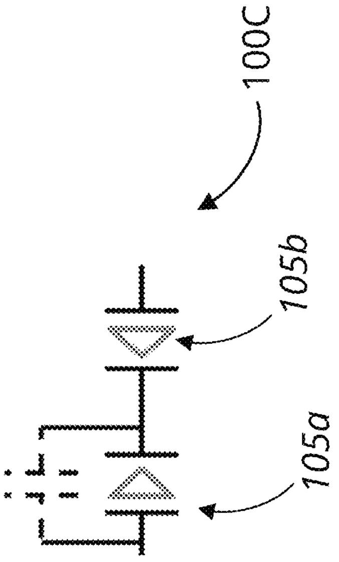
FIG. 1C is a schematic circuit diagram of the pair of bulk acoustic wave resonators in powerbar configuration, in accordance with various embodiments.

Accordingly, in some embodiments, an overlapping area of the first resonator 105*a* may be configured to mitigate a mismatch in capacitance (or parasitic capacitance) of the second resonator 105*b*. Specifically, differences in parasitic capacitance of individual resonators will cause differences in the respective parallel resonant frequency $f_p$ and respective series resonant frequency $f_s$ of the respective resonators. Thus, the differences in parasitic capacitance may be mitigated by capacitive loading of one or more of the resonators in a powerbar and/or quadbar, as can be seen with reference to FIG. 1C. FIG. 1C is a schematic circuit diagram of the pair of bulk acoustic wave resonators in powerbar configuration 100C, in accordance with various embodiments. In the aforementioned example, the first resonator 105*a* is capacitively loaded using a larger first top electrode 115, creating a larger overlapping area with the first bottom electrode 110. Thus, the overlapping area may be determined based, at least in part, on a difference in parasitic capacities of the first and second resonators 105*a*, 105*b*.

In some examples, the overlapping area may be an area of overlap along a connecting edge. The connecting edge may be an area in which the top and bottom electrodes overlap at the connecting edge, where the resonator is not acoustically active (e.g., not over a piezoelectric layer and/or cavity between the bottom electrode and substrate).

In various embodiments, the overlapping area may refer to a surface area of the top electrode that is in direct contact with the bottom electrode in the acoustically inactive area, or "dead region." Thus, in some examples, the overlapping area may be a two-dimensional area in which the top and bottom electrodes overlap directly.

In various embodiments, the first and second bottom electrodes 110, 120, first and second top electrodes 115, 125, and first and second piezoelectric layers 130, 135 may be planar structures. In some examples, the bottom and top electrodes 110, 115, 120, 125 may be formed of a conductive material, such as metal (e.g., copper (Cu), Silver (Ag), gold (Au), aluminum (Al), etc.) or other suitable conductive material. In various embodiments, the piezoelectric layers 130, 135 may be thin-film piezoelectric layers made of a piezoelectric material. In some examples, the piezoelectric layer 130, 135 is an aluminum nitride (AlN) piezoelectric material. In other examples, other materials may be used, for example, zinc oxide (ZnO), or other suitable piezoelectric crystalline material. In some embodiments, individual resonators that are part of the same quadbar (or powerbar) may have piezoelectric layers that are the same size (e.g., within the tolerances of a respective manufacturing process).

Conventional approaches to capacitive loading, such as adjusting the frame elements, also referred to as "outies," also change a resonator's acoustic behavior. Accordingly, by increasing bottom electrode-top electrode overlap, and in some embodiments, overlap of the bottom electrode and top electrode at the connecting edge of the respective resonator, the mismatch in parasitic capacitance may be mitigated via capacitive loading, without affecting the acoustic characteristics of the resonator.

Figure 2A:
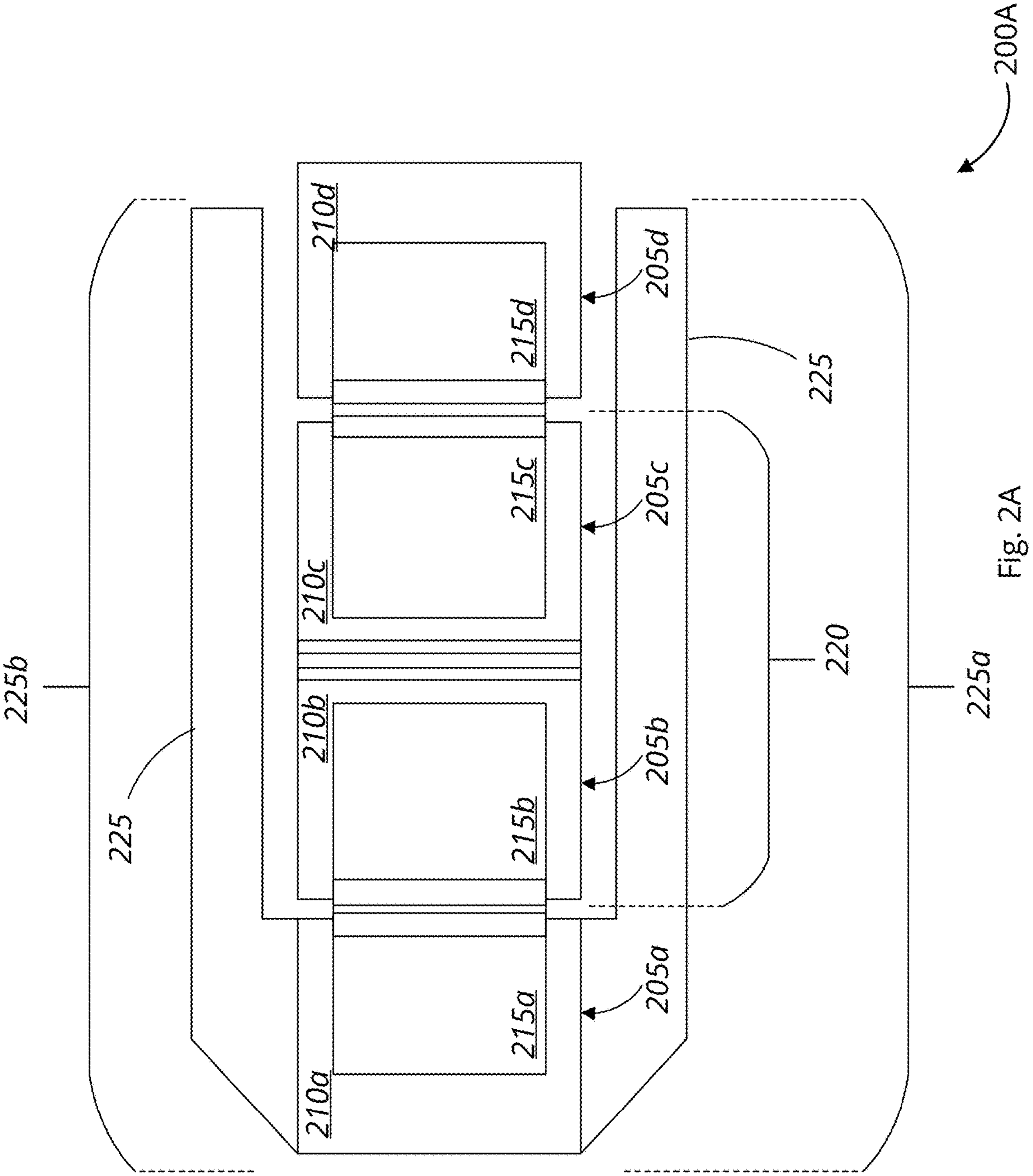
FIG. 2A is a schematic diagram of a quadbar with a bulk acoustic wave resonator shielding structure, in accordance with various embodiments.
Figure 2B:
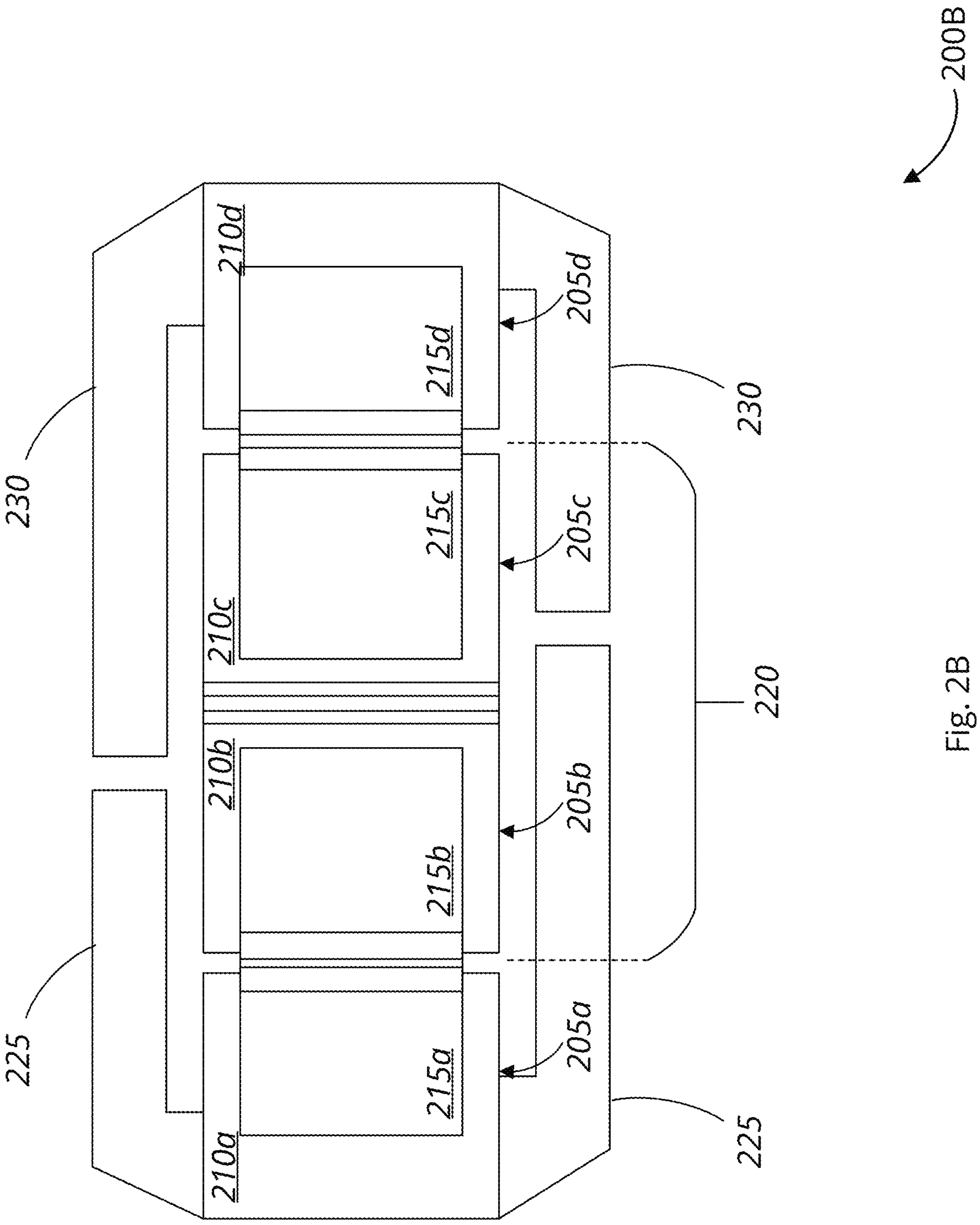
FIG. 2B is a schematic diagram of a quadbar with a bulk acoustic wave resonator having an alternative first shielding structure, in accordance with various embodiments.
Figure 2C:
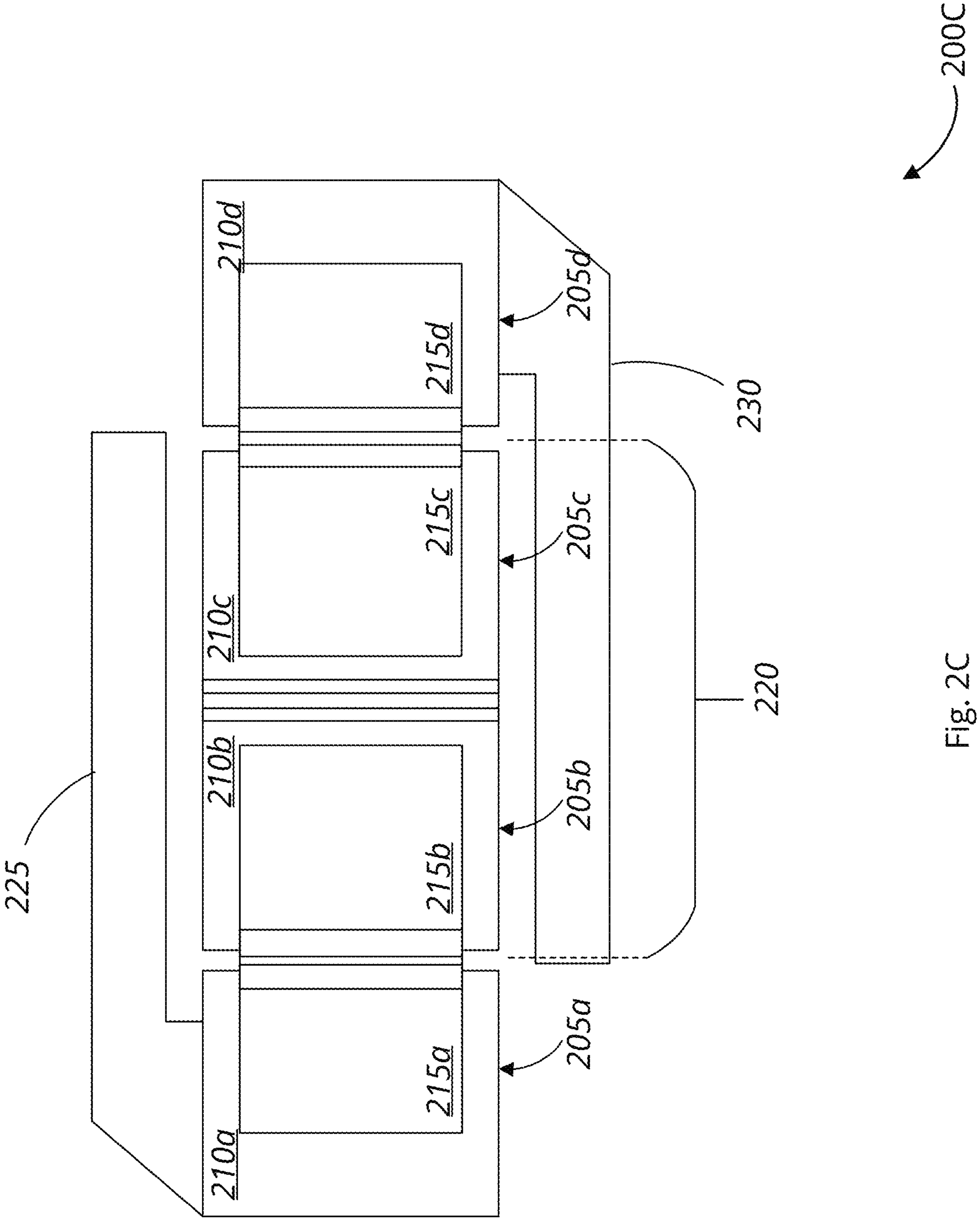
FIG. 2C is a schematic diagram of a quadbar with a bulk acoustic wave resonator having a second alternative shielding structure, in accordance with various embodiments.

In further embodiments, shielding and/or equipotentialing may also be used to reduce beat mode in quadbars. FIGS. 2A-2C illustrate quadbar configurations in which a shielding structure is provided. FIGS. 2A-2C show a schematic diagram of a quadbar 200A-200C with a bulk acoustic wave resonator having shielding structure, in accordance with various embodiments. The quadbars 200A-200C includes a first bulk acoustic wave resonator 205*a* (hereinafter "first resonator 205*a*"), second bulk acoustic wave resonator 205*b* (hereinafter "second resonator 205*b*"), third bulk acoustic wave resonator 205*b* (hereinafter "second resonator 205*c*"), and a fourth bulk acoustic wave resonator 205*b* (hereinafter "second resonator 205*d*"). The first resonator 205*a* includes first bottom electrode 210*a*, and first top electrode 215*a*. The second resonator 205*b* includes second bottom electrode 210*b*, and second top electrode 215*b*. The third resonator 205*c* includes third bottom electrode 210*c*, and third top electrode 215*c*. The fourth resonator 205*d* includes fourth bottom electrode 210*d*, and fourth top electrode 215*d*. It should be noted that the various parts and components of quadbars 200A-200C are schematically illustrated in FIGS. 2A-2C, and that modifications to the various components and other arrangements of the quadbar 200A-200C may be possible and in accordance with the various embodiments.

Each of the first, second, third, and fourth resonators 205*a*-205*d* may be coupled in series to form the quadbar 200A. The quadbar 200A, accordingly, includes central resonators 220, which include the second resonator 205*b* and third resonator 205*c*. Outer resonators, correspondingly, include the first resonator 205*a* and fourth resonator 210*d*.

With reference to FIG. 2A, the first bottom electrode 210*a* includes a shielding structure 225, configured to extend around the central resonators 220. The shielding structure 225, in some examples, are extensions of the first bottom electrode 210*a*, which extend around both sides (e.g., top and bottom) of the central resonators 220. For example, the shielding structure 225 may include a bottom member 225*a* and a top member 225*b*, where each member is an elongated structure (e.g., an "elongated member") extending from first bottom electrode 210*a*. In various examples, the elongated structure may be referred to as having a length that extends in a "longitudinal direction," and a width that extends in a "transverse direction."

FIG. 2B is a schematic diagram of a quadbar 200B with a bulk acoustic wave resonator having an alternative first shielding structure, in accordance with various embodiments. In contrast with FIG. 2A, FIG. 2B includes a first shielding structure 225 and a second shielding structure 230.

The first shielding structure 225 may be formed from the first bottom electrode 210*a* and extend around both sides of at least one of the central resonators 220. The second shielding structure 230 may be formed from the fourth bottom electrode 210*d* and extend around both sides of at least one of the central resonators 220. In this way, both the first and second shielding structures 225, 230 may include top and bottom members, as in the quadbar 200A of FIG. 2A.

In the example depicted, the bottom member of the first shielding structure 225 extends beyond the bottom side of the second resonator 205*b*, and at least part of the third resonator 205*c*. The top member of the first shielding structure 225 extends at least partially along the top side of the second resonator 205*b*. The top member of the second shielding structure 230, in turn, extends beyond the top side of the third resonator 205*c*, and at least part of the second resonator 205*b*. The bottom member of the second shielding structure 230 extends at least partially along the bottom side of the third resonator 205*c*. In this way, the first shielding structure 225 and second shielding structure 230 are both asymmetric structures, in which the top and bottom members have differing dimensions. In other examples, the first and second shielding structures 225, 230 may include top and bottom members that are symmetrical or near symmetrical (e.g., within the tolerances of a respective manufacturing process).

FIG. 2C is a schematic diagram of a quadbar 200C with a bulk acoustic wave resonator having a second alternative shielding structure, in accordance with various embodiments. Quadbar 200C includes a first shielding structure 225 and a second shielding structure 230. The first shielding structure 225 may be formed from the first bottom electrode 210*a* and extend around one side of the central resonators 220 (either top or bottom side). In the example depicted, the first shielding structure 225 extends around a top side of the central resonators 220. The second shielding structure 230 may be formed from the fourth bottom electrode 210*d* and extend around an opposite side of the central resonators 220 from the first shielding structure 225. In the example depicted, the second shielding structure 230 extends along the bottom side of the central resonators 220.

In the example depicted, the first shielding structure 225 extends beyond the top side of the third resonator 205*c*. It is to be understood that in other embodiments, the first shielding structure 225 may extend at least partially along the top side of at least one of the second or third resonators 205*b*, 205*c*. In yet further embodiments, the first shielding structure 225 may extend around the top sides of the central resonators 220, and at least partially extend along the top side of the fourth resonator 205*d*. Similarly, the second shielding structure 230 may extend along at least partially along the bottom side of at least one of the second or third resonators 205*b*, 205*c*. In yet further embodiments, the first shielding structure 225 may extend around the bottom sides of the central resonators 220, and at least partially extend along the bottom side of the first resonator 205*a*.

In yet further embodiments, the first shielding structure 225 may instead extend along the bottom side of the central resonators 220 and/or fourth resonator 205*d*. The second shielding structure 230, in turn, may instead extend along the top side of the central resonators 220 and/or first resonator 205*a*.

Thus, in various embodiments, with reference to FIGS. 2A-2C, the shielding structure(s) 225, 230 shield the quadbar 200A-200C and/or central resonators 220 on both the bottom and top sides. The shielding structures 225, 230 provide an equipotential reference for each of the central resonators 220, isolating the central resonators 220 from its surroundings, thereby mitigating the effects of parasitic capacitance and/or reducing beat mode.

In some embodiments, the shielding structures 225, 230 may be utilized in combination with the capacitive loading of individual resonators, as described above with respect to FIGS. 1A-1C. For example, pairs of individual resonators may be configured such that a difference in parasitic capacitance is minimized, wherein at least one resonator of a pair of resonators is capacitively loaded as previously described (e.g., via overlap of the bottom and top electrodes). The pairs of resonators (e.g., two pairs of resonators in a quadbar) may further include shielding structures on at least one of the resonators to provide shielding to the central resonators of a quadbar.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:

one or more first resonators, each first resonator having a respective parasitic capacitance;

a second resonator having a second parasitic capacitance, the second resonator comprising:

a substrate;

a bottom electrode disposed on the substrate;

a piezoelectric layer disposed on the bottom electrode;

a top electrode disposed on the piezoelectric layer;

wherein in a first region, the bottom electrode and top electrode overlap with no piezoelectric layer between the bottom electrode and top electrode, wherein an area of the first region is determined based, at least in part, on a difference in parasitic capacitance between the second resonator and at least one of the one or more first resonators.

2. The apparatus of claim 1, wherein at least one first resonator has a first piezoelectric orientation, wherein the second resonator has a second piezoelectric orientation that is opposite from the first piezoelectric orientation.

3. The apparatus of claim 2, wherein the at least one first resonator and second resonator are placed in a parallel configuration.

4. The apparatus of claim 2, wherein the at least one first resonator and second resonator are placed in a series configuration.

5. The apparatus of claim 1, wherein the first region is a dead region.

6. The apparatus of claim 1, wherein the first region is along a connecting edge of the second resonator.

7. The apparatus of claim 1, wherein the first region mitigates a mismatch in parasitic capacitance without affecting acoustic characteristics of the second resonator.

8. The apparatus of claim 1, wherein the one or more first resonators and the second resonator are part of a ladder filter.

9. A ladder filter, comprising:

one or more series-arm resonators; and one or more parallel-arm resonators, wherein at least one of the series-arm resonators or the parallel-arm resonators comprises:

a substrate;

a bottom electrode disposed on the substrate;

a piezoelectric layer disposed on the bottom electrode; and a top electrode disposed on the piezoelectric layer;

wherein at a connecting edge of the at least one of the series-arm resonators or the parallel-arm resonators, the bottom electrode and the top electrode overlap in a dead region with no piezoelectric layer between the bottom electrode and the top electrode; and wherein an overlapping area of the dead region is based, at least in part, on a difference in parasitic capacitance between the at least one of the series-arm resonators or the parallel-arm resonators and an adjacent resonator of the ladder filter.

10. The ladder filter of claim 9, wherein the at least one of the series-arm resonators or the parallel-arm resonators and the adjacent resonator are in a powerbar configuration.

11. The ladder filter of claim 9, wherein the at least one of the series-arm resonators or the parallel-arm resonators has a first piezoelectric orientation, and the adjacent resonator has a second piezoelectric orientation that is opposite from the first piezoelectric orientation.

12. The ladder filter of claim 9, wherein the overlapping area of the dead region mitigates a mismatch in parasitic capacitance without affecting acoustic characteristics of the at least one of the series-arm resonators or the parallel-arm resonators.

13. The ladder filter of claim 9, wherein the overlapping area of the dead region is configured such that the parasitic capacitance of the at least one of the series-arm resonators or the parallel-arm resonators substantially matches the parasitic capacitance of the adjacent resonator.

14. The ladder filter of claim 9, wherein the at least one of the series-arm resonators or the parallel-arm resonators is a film bulk acoustic resonator.

15. The ladder filter of claim 9, wherein the piezoelectric layer comprises aluminum nitride.

16. An apparatus, comprising:

a first bulk acoustic wave resonator having a first parasitic capacitance; and a second bulk acoustic wave resonator having a second parasitic capacitance, the second resonator comprising:

a substrate;

a bottom electrode disposed on the substrate;

a piezoelectric layer disposed on the bottom electrode; and a top electrode disposed on the piezoelectric layer;

wherein at a connecting edge of the second resonator, the bottom electrode and the top electrode overlap in a dead region with no piezoelectric layer between the bottom electrode and the top electrode; and wherein an overlapping area of the dead region is based, at least in part, on a difference in parasitic capacitance between the first resonator and the second resonator.

17. The apparatus of claim 16, wherein the overlapping area of the dead region is configured such that the second parasitic capacitance substantially matches the first parasitic capacitance.

18. The apparatus of claim 16, wherein the first resonator has a first piezoelectric orientation, and the second resonator has a second piezoelectric orientation that is opposite from the first piezoelectric orientation.

19. The apparatus of claim 16, wherein the first resonator and the second resonator are in a powerbar configuration.

20. The apparatus of claim 16, wherein the overlapping area of the dead region mitigates a mismatch in parasitic capacitance without affecting acoustic characteristics of the second resonator.

* * * * *